(12) United States Patent
Taghivand et al.

(10) Patent No.: US 7,855,610 B2
(45) Date of Patent: Dec. 21, 2010

(54) VCO CAPACITOR BANK TRIMMING AND CALIBRATION

(75) Inventors: Mazhareddin Taghivand, Campbell, CA (US); Jeongsik Yang, Cupertino, CA (US); Sang-Oh Lee, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

(21) Appl. No.: 12/116,527

(22) Filed: May 7, 2008

(65) Prior Publication Data

US 2009/0278620 A1    Nov. 12, 2009

(51) Int. Cl.
*H03B 5/08* (2006.01)

(52) U.S. Cl. .................. 331/167; 331/36 C; 331/177 R

(58) Field of Classification Search ............... 331/36 C, 331/177 R, 117 R, 36 R, 117 FE, 167
See application file for complete search history.

(56) References Cited

U.S. PATENT DOCUMENTS

| | | | |
|---|---|---|---|
| 6,424,209 B1 * | 7/2002 | Gorecki et al. | 327/554 |
| 6,512,419 B1 | 1/2003 | Adams et al. | |
| 6,806,781 B2 * | 10/2004 | Bisanti et al. | 331/36 R |
| 7,280,001 B2 | 10/2007 | Maligeorgos et al. | |
| 2002/0060601 A1 * | 5/2002 | Rastegar | 327/543 |
| 2004/0150483 A1 * | 8/2004 | Cho | 331/117 R |
| 2007/0115069 A1 * | 5/2007 | Fujita et al. | 331/36 C |
| 2007/0182494 A1 | 8/2007 | Talwalkar | |
| 2008/0048788 A1 * | 2/2008 | Yu | 331/16 |

OTHER PUBLICATIONS

International Search Report - PCT/US09/043038 - International Search Authority - European Patent Office - Jun. 29, 2009.

* cited by examiner

*Primary Examiner*—Joseph Chang
*Assistant Examiner*—Jeffrey Shin
(74) *Attorney, Agent, or Firm*—Jiayu Xu

(57) ABSTRACT

Techniques are disclosed for trimming a capacitance associated with a capacitor bank for use in a voltage-controlled oscillator (VCO). In an embodiment, each capacitance is sub-divided into a plurality of constituent capacitances. The constituent capacitances may be selectively enabled or disabled to trim the step sizes of the capacitor bank. Further techniques are disclosed for calibrating the trimmable capacitance to minimize step size error for the capacitor bank.

16 Claims, 12 Drawing Sheets

CALIBRATION PHASE

CALIBRATION PHASE

OPERATION PHASE

VCO CAPACITOR BANK TRIMMING AND CALIBRATION

TECHNICAL FIELD

The disclosure relates to voltage-controlled oscillators (VCO's), and more particularly, to techniques for trimming the capacitance associated with a capacitor bank in a VCO.

BACKGROUND

A voltage-controlled oscillator (VCO) is an electrical oscillator having an output frequency controlled by a voltage input. FIG. 1 depicts a prior art VCO design employing an oscillator circuit 100 coupled to an LC tank 104 having a variable resonant frequency. A capacitance within the LC tank may be implemented as a capacitor bank 106, whose value may be selected by a nominal frequency control signal 108.

FIG. 2 shows an implementation of capacitor bank 106, wherein a plurality of selectable capacitances C.0 through C.(N−1) are coupled in parallel. In FIG. 2, the smallest capacitance C.0 has a value associated with a least significant bit (LSB) of the capacitor bank, while each successive capacitance C.n has nominally twice the value of the previous capacitance C.(n−1), i.e., the capacitances are binary-weighted.

In FIG. 2, each capacitance C.0 through C.(N−1) may be enabled or disabled by closing or opening, respectively, a corresponding switch S.0 through S.(N−1). By configuring the switches S.0 through S.(N−1), an arbitrary subset of the binary-weighted capacitances C.0 through C.(N−1) may be selected to vary the resonant frequency of the LC tank.

Ideally, the discrete step size of the capacitor bank, i.e., the change in actual capacitance from a selectable value of the capacitor bank to the next-largest selectable value, is uniformly 1 LSB over the entire range of selectable capacitances. In practice, however, the step size may deviate from 1 LSB due to mismatch, process variations, and/or other factors. FIG. 3 illustrates non-uniform step sizes typically encountered in practical implementations of a capacitor bank 106. From FIG. 3, it can be seen that the step size may deviate considerably over the range of selectable capacitances, causing significant error in the actual capacitance delivered by the capacitor bank. Note FIG. 3 is provided as an illustration only, and is not meant to restrict the scope of the present disclosure to any particular range of capacitance values or step sizes.

It would be desirable to have techniques to calibrate the capacitances available in a capacitor bank to provide more uniform step sizes and improved accuracy in selecting the oscillating frequency of a VCO.

SUMMARY

An aspect of the present disclosure provides a capacitor bank for a voltage-controlled oscillator (VCO), the capacitor bank comprising a plurality of nominal selectable capacitances, at least one of the nominal selectable capacitances comprising: at least one sub-capacitance configurable to contribute to the capacitance of the at least one selectable capacitance based on a trim setting control signal, the at least one sub-capacitance having a capacitance less than the nominal value of the at least one of the nominal selectable capacitances.

Another aspect of the present disclosure provides a voltage-controlled oscillator (VCO) comprising: a capacitor bank comprising a plurality of nominal selectable capacitances, at least one of the nominal selectable capacitances comprising: at least one sub-capacitance configurable to contribute to the capacitance of the at least one selectable capacitance based on a trim setting control signal, the at least one sub-capacitance having a capacitance less than the nominal value of the at least one of the nominal selectable capacitances.

Yet another aspect of the present disclosure provides a method for adjusting the output frequency of a voltage-controlled oscillator (VCO), the VCO comprising a capacitor bank, the capacitor bank comprising a plurality of nominal selectable capacitances, the method comprising: during a calibration phase, providing at least one nominal frequency control signal to the capacitor bank in the VCO, and determining a trim setting control signal for the capacitor bank corresponding to said at least one nominal frequency control signal; during an operation phase, applying the at least one nominal frequency control signal to said capacitor bank in the VCO in conjunction with the corresponding trim setting control signal determined during said calibration phase.

Yet another aspect of the present disclosure provides a voltage-controlled oscillator (VCO) comprising: means for, during a calibration phase, providing at least one nominal frequency control signal to the capacitor bank in the VCO, and determining a trim setting control signal for the capacitor bank corresponding to said at least one nominal frequency control signal; and means for, during an operation phase, applying the at least one nominal frequency control signal to said capacitor bank in the VCO in conjunction with the corresponding trim setting control signal determined during said calibration phase.

Yet another aspect of the present disclosure provides a computer program product for adjusting the output frequency of a voltage-controlled oscillator (VCO), the VCO comprising a capacitor bank, the capacitor bank comprising a plurality of nominal selectable capacitances, the product comprising: computer-readable medium comprising: code for causing a computer to, during a calibration phase, provide at least one nominal frequency control signal to the capacitor bank in the VCO, and determine a trim setting control signal for the capacitor bank corresponding to said at least one nominal frequency control signal; code for causing a computer to, during an operation phase, apply the at least one nominal frequency control signal to said capacitor bank in the VCO in conjunction with the corresponding trim setting control signal determined during said calibration phase.

Yet another aspect of the present disclosure provides a capacitor bank for a voltage-controlled oscillator (VCO), the capacitor bank comprising a plurality of nominal selectable capacitances, the plurality of nominal selectable capacitances comprising a minimum capacitance associated with a least significant bit (LSB), the capacitor bank further comprising: a trim network comprising a plurality of selectable trim capacitances for adjusting the capacitance of the capacitor bank, the plurality of selectable trim capacitances comprising at least one trim capacitance less than the capacitance associated with the (LSB).

DETAILED DESCRIPTION

The present disclosure provides techniques to trim one or more of the capacitances within a capacitor bank, and to calibrate the trim settings of such capacitances to provide more uniform step sizes and improved accuracy in selecting the oscillating frequency of a VCO.

Figure 4:
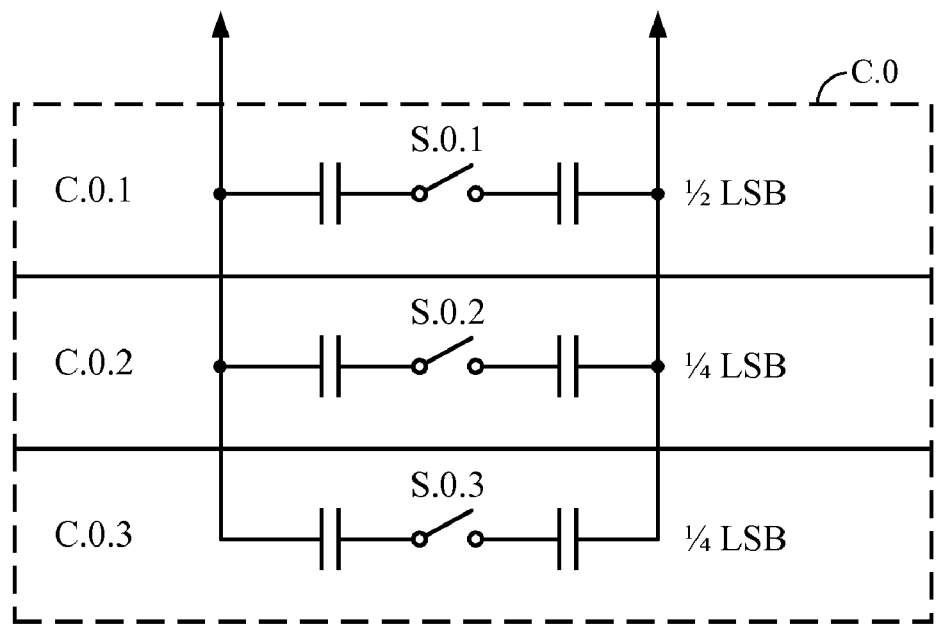
FIG. 4 depicts a technique according to the present disclosure for trimming a capacitance of a capacitor bank.

FIG. 4 depicts a technique according to the present disclosure for trimming capacitance C.0 of the capacitor bank 106. In FIG. 4, capacitance C.0, having a nominal value of 1 LSB, is sub-divided into multiple constituent capacitances C.0.1, C.0.2, and C.0.3. Capacitance C.0.1 nominally contributes ½ LSB of capacitance when switch S.0.1 is closed, while capacitors C.0.2 and C.0.3 each nominally contribute ¼ LSB of capacitance when switches S.0.2 and S.0.3 are closed, respectively. By selectively opening or closing switches S.0.1, S.0.2, S.0.3, the actual capacitance associated with C.0 may be "trimmed" down from its nominal value.

Figure 5:
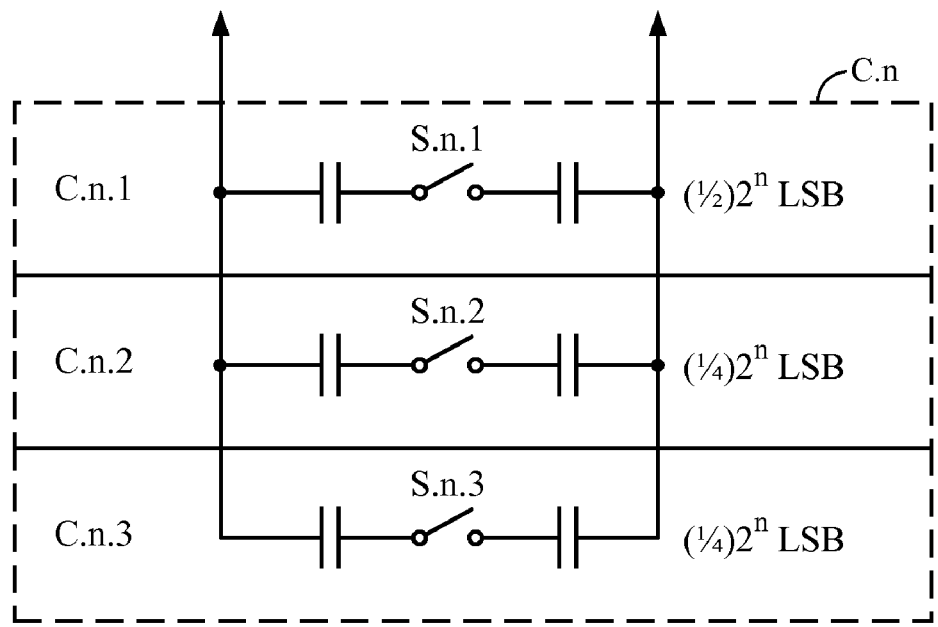
FIG. 5 depicts an embodiment wherein an arbitrary capacitance C.n is sub-divided into multiple capacitances C.n1, C.n2, C.n3 according to the principles described herein.

One of ordinary skill in the art will appreciate that the techniques described with reference to FIG. 4 may readily be applied to trim the capacitance associated with any of the binary-weighted capacitors shown in FIG. 2. For example, FIG. 5 depicts an embodiment wherein an arbitrary capacitance C.n, having a nominal value of $2^n$ LSB, is sub-divided into multiple capacitances C.n1, C.n2, C.n3 according to the same principles disclosed with reference to FIG. 4. In FIG. 5, capacitance C.n1 nominally contributes (½) $2^n$ LSB of capacitance when switch S.n1 is closed, while C.n2, C.n3 each nominally contribute (¼) $2^n$ LSB of capacitance when switches S.n2, S.n3 are closed, respectively.

Figure 1:
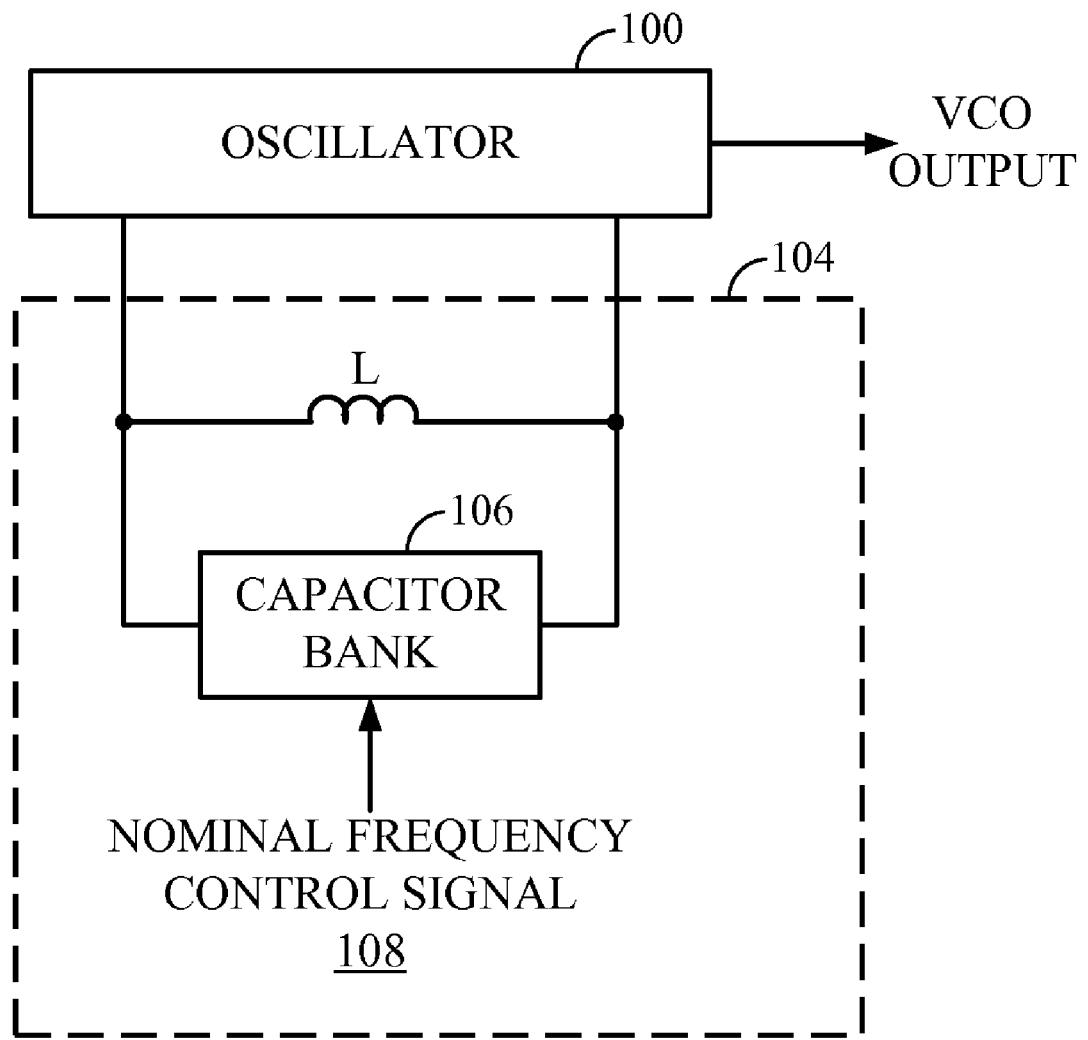
FIG. 1 depicts a prior art VCO design employing an oscillator circuit 100 coupled to an LC tank circuit 104 having a variable resonant frequency.
Figure 2:
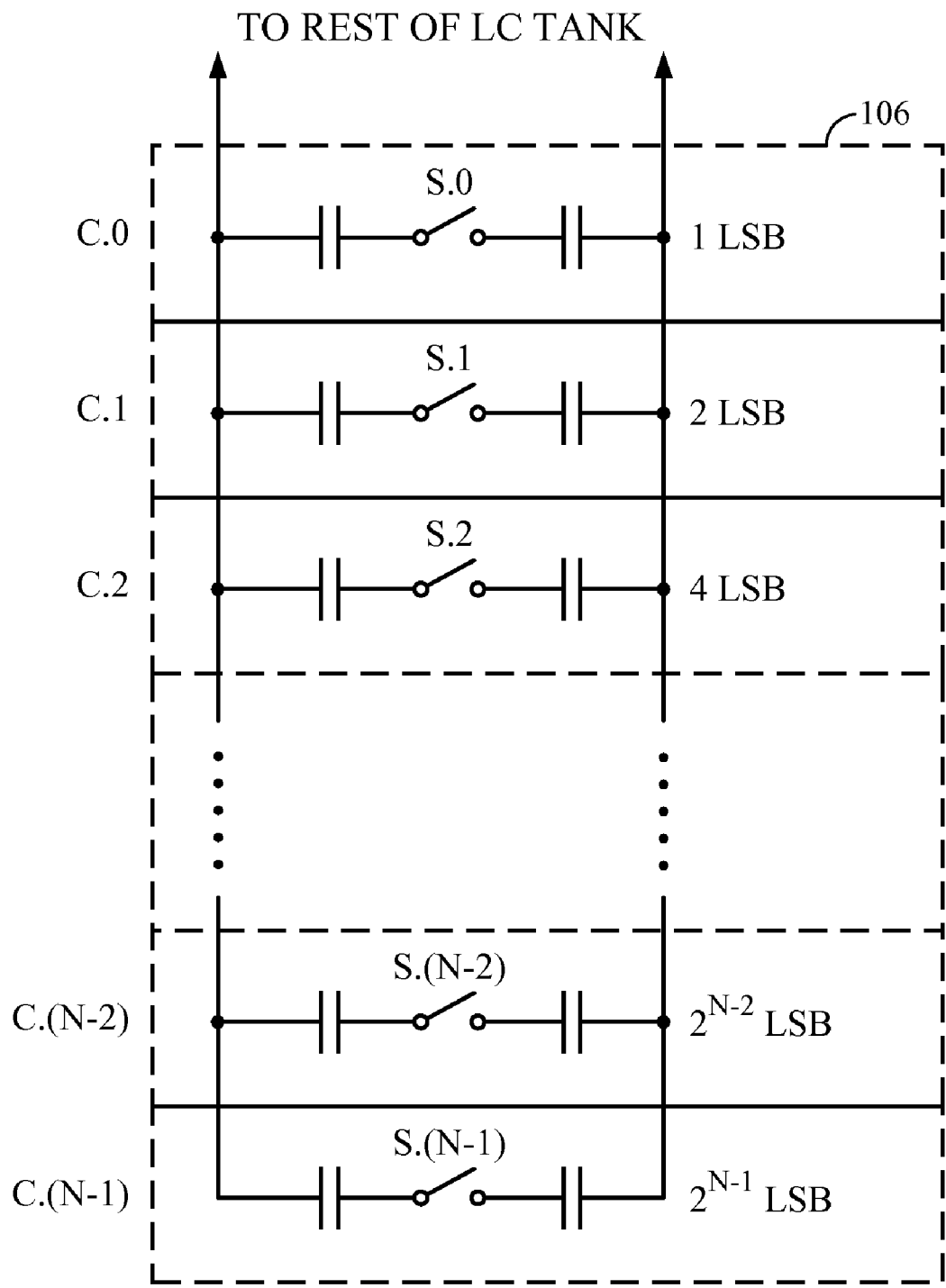
FIG. 2 shows an implementation of capacitor bank 106, wherein a plurality of capacitances C.0 through C.(N−1) are coupled in parallel.
Figure 3:
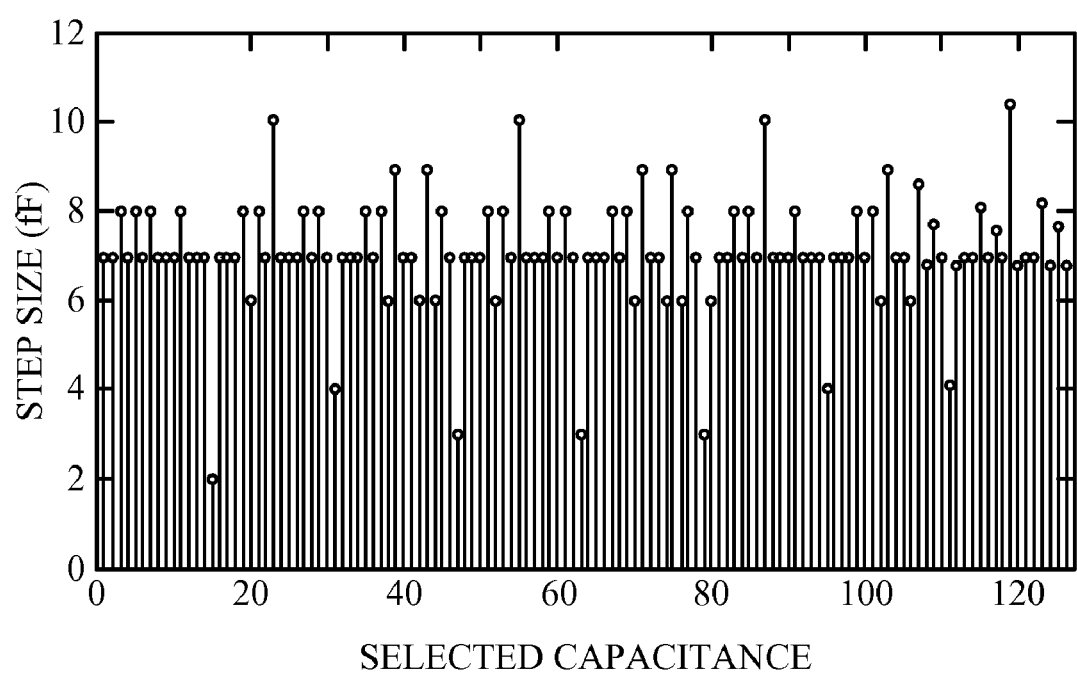
FIG. 3 illustrates non-uniform step sizes typically encountered in practical implementations of a capacitor bank 106.

One of ordinary skill in the art will appreciate that by implementing each binary-weighted capacitance shown in FIG. 2 as an instance of the capacitance network of FIG. 5, each capacitance shown in FIG. 2 can be trimmed.

According to the present disclosure, an arbitrary capacitance may be sub-divided into any number of constituent capacitances in accordance with the principles disclosed herein. For example, additional capacitors C.n.4, C.n.5, etc. (not shown), may be provided beyond those shown in FIG. 5 to further subdivide the resolution of the trimming, e.g., to provide for switchable capacitances of (⅛) $2^n$ LSB, (1/16) $2^n$ LSB, etc. Such embodiments are contemplated to be within the scope of the present disclosure.

Figure 6:
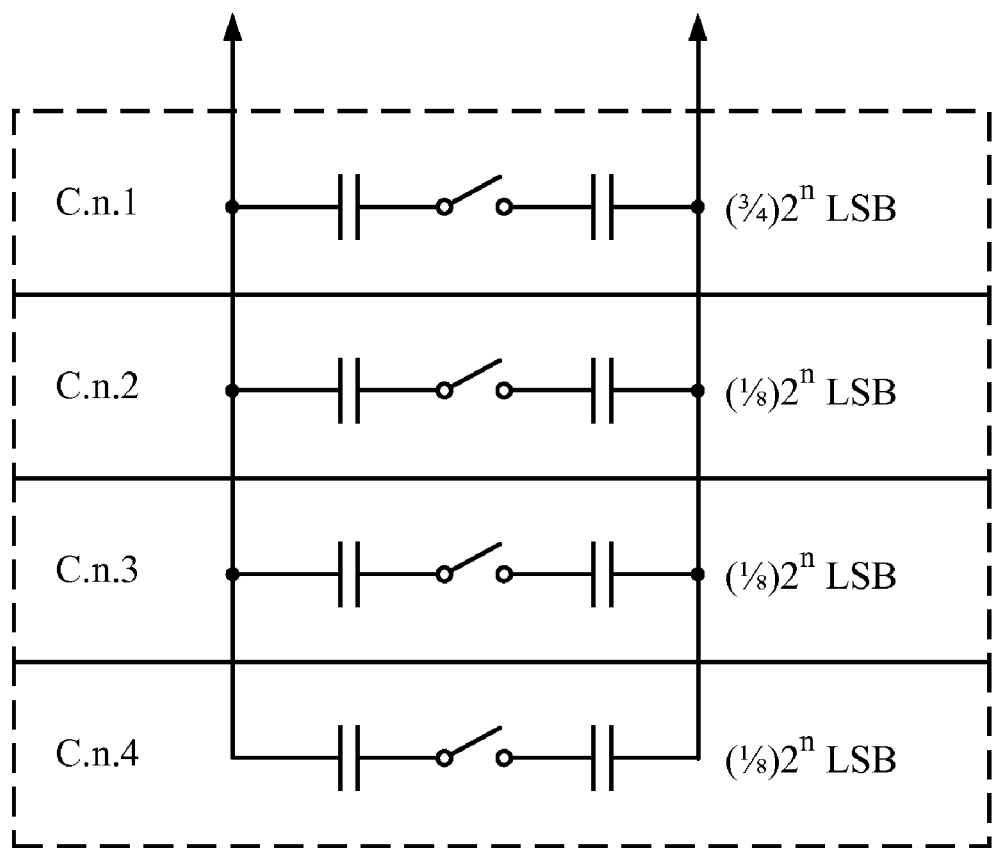
FIG. 6 depicts an embodiment wherein a capacitance C.n having nominal capacitance $2^n$ LSB is alternatively implemented as a set of multiple smaller capacitances C.n1, C.n2, C.n3, C.n4.

One of ordinary skill in the art may also readily derive alternative ways to trim the capacitance different from the embodiments shown. For example, FIG. 6 depicts an embodiment wherein a capacitance C.n having nominal capacitance $2^n$ LSB is implemented as a set of switchable multiple smaller capacitances C.n.1, C.n.2, C.n.3, C.n.4. Capacitance C.n.1 nominally contributes (¾) $2^n$ LSB of capacitance when switch S.n.1 is closed, while capacitors C.n.2, C.n.3, C.n.4 each nominally contribute ⅛ LSB of capacitance when switches S.n.2, S.n.3, S.n.4 are closed, respectively. The sum of the multiple smaller capacitances add up to more than the nominal $2^n$ LSB capacitance associated with C.n, allowing the capacitance of C.n to be trimmed above as well as below the nominal value if necessary. Such embodiments are also contemplated to be within the scope of the present disclosure.

Note in an embodiment, such as the one shown in FIG. 5, the capacitance of C.n in the capacitor bank need only be trimmed down from its nominal value, not up. Such a restriction in the configurability of the trimming may be advantageous to save layout area in an integrated-circuit embodiment of the present disclosure. An embodiment incorporating only down-trimming may provide sufficient accuracy where, e.g., the capacitor bank is itself further combined with an additional voltage-controlled capacitance (varactor) that provides for further fine adjustment of the LC tank resonant frequency.

Embodiments have been disclosed hereinabove showing capacitive networks that are enabled by closing a switch coupling two series capacitances. One of ordinary skill in the art will realize that the same techniques apply to any implementation of a variable capacitance. For example, an alternative switch-enabled capacitance may be implemented as a switch coupled in series with a single capacitor, and/or switches coupled in parallel with, or in parallel and series with capacitors in any combination. A trimming capacitance may also be implemented using an element having a continuously variable capacitance, such as a varactor, whose capacitance is controlled by an analog control signal. Such embodiments are contemplated to be within the scope of the present disclosure.

Furthermore, embodiments have been disclosed hereinabove showing capacitive networks constructed from binary-weighted capacitances. One of ordinary skill in the art will appreciate that the same techniques may be applied to trim capacitances weighted according to any capacitance weighting scheme. Such embodiments are contemplated to be within the scope of the present disclosure.

Techniques for allowing the capacitances within a capacitor bank to be trimmed have been disclosed hereinabove. Further disclosed hereinbelow are techniques to calibrate the trim settings of such capacitances to provide for more uniform step sizes and improved accuracy.

Figure 7:
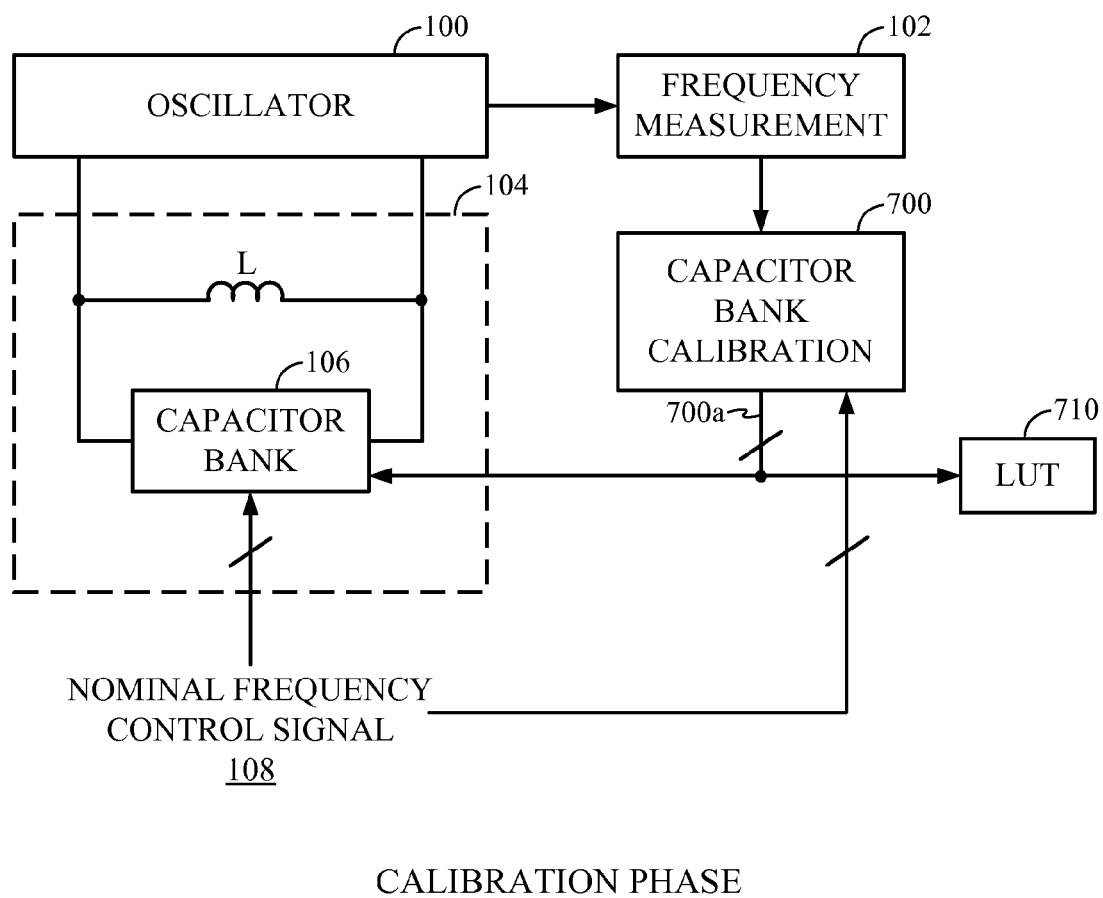
FIG. 7 depicts an embodiment of a calibration set-up according to the present disclosure.

FIG. 7 depicts an embodiment of a calibration set-up according to the present disclosure. In FIG. 7, a nominal frequency control signal 108 sets a nominal desired oscillating frequency of a VCO by adjusting the nominal capacitance of the capacitor bank 106. The output signal of the VCO is coupled to a frequency measurement module 102, which outputs a signal indicative of the actual frequency of the VCO output signal. The output signal of the frequency measurement module 102 is coupled to the capacitor bank calibration module 700, which compares the actual frequency of the VCO output signal with the nominal frequency control signal 108. Based on the comparison, the capacitor bank calibration module 700 outputs a trimming signal 700a to the capacitor bank 106 to trim the nominal capacitance so that the VCO output frequency better approximates the nominal frequency. Preferred trim settings determined through the calibration procedure may be stored in a look-up table (LUT) 710, which may contain entries associating each capacitance C.0 through C.(N−1) with a calibrated trim setting according to the present disclosure.

Note in view of the techniques described with reference to FIG. 7, one of ordinary skill in the art may readily derive alternative schemes for calibrating the capacitances in the capacitor bank 106.

Figure 8:
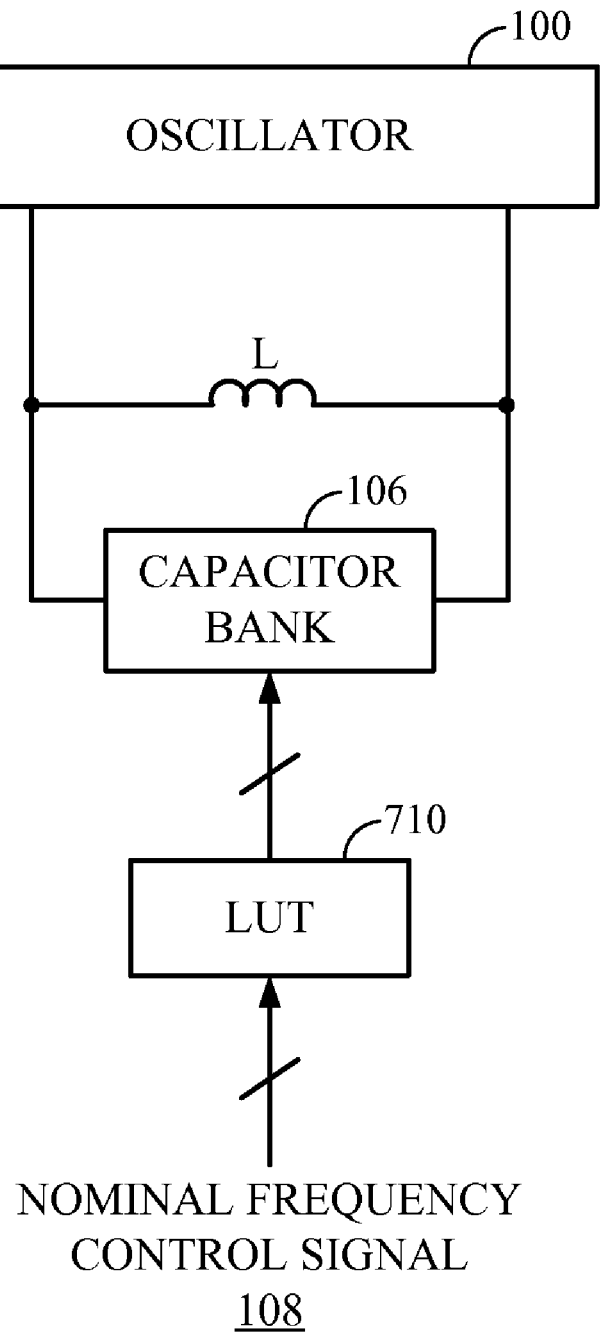
FIG. 8 depicts an embodiment of normal VCO operation according to the present disclosure.

FIG. 8 depicts an embodiment of normal VCO operation according to the present disclosure. In FIG. 8, a nominal frequency control signal 108 may specify a nominal capacitance of the capacitor bank 106. The frequency control signal 108 may be supplied to the look-up table (LUT) 710, which stores trim setting values derived, for example, from the calibration procedure described with reference to FIG. 7. Based on the nominal frequency control signal 108, the LUT 710 outputs the associated preferred trim settings of the capacitor bank 106 to allow the actual capacitance of the capacitor bank to best approximate the nominal capacitance.

Figure 9:
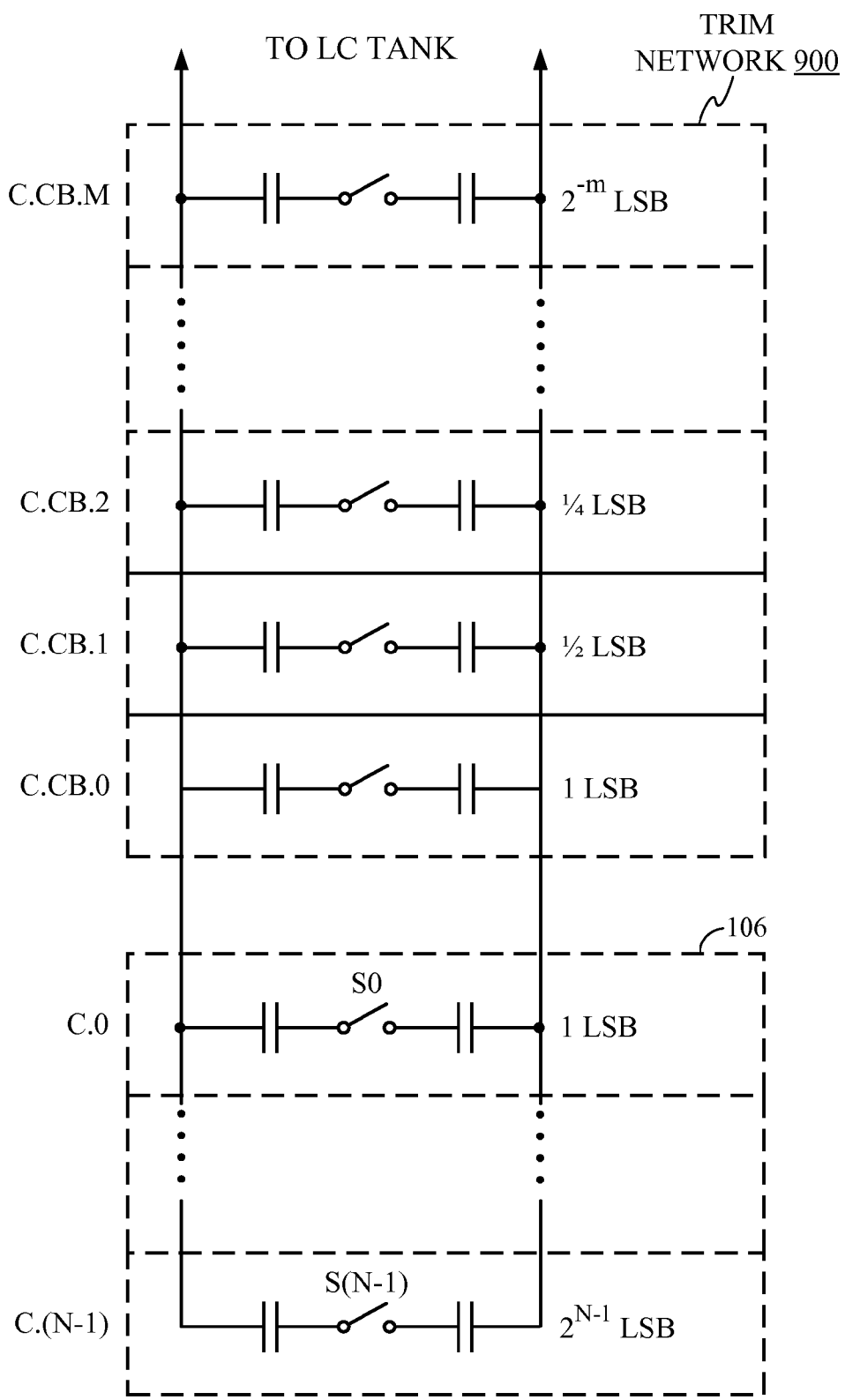
FIG. 9 depicts a further embodiment of the present disclosure wherein a single trim network 900 is provided to trim the step size associated with each capacitance C.0 through C.N−1 of the capacitor bank 106.

FIG. 9 depicts a further embodiment of the present disclosure wherein a single trim network 900 is provided to trim the step size associated with each capacitance C.0 through C.(N−1) of the capacitor bank 106. In FIG. 9, a trim network 900 is coupled in parallel to capacitances C.0 through C.(N−1). The trim network 900 may comprise a set of parallel-coupled binary-weighted capacitances ranging from 1 LSB to $2^{(-M)}$ LSB as shown, where M is a positive integer. Alternatively, the trim network 900 may comprise capacitances having any set of values that allows for trimming the net capacitance of the capacitor bank 106.

Figure 10:
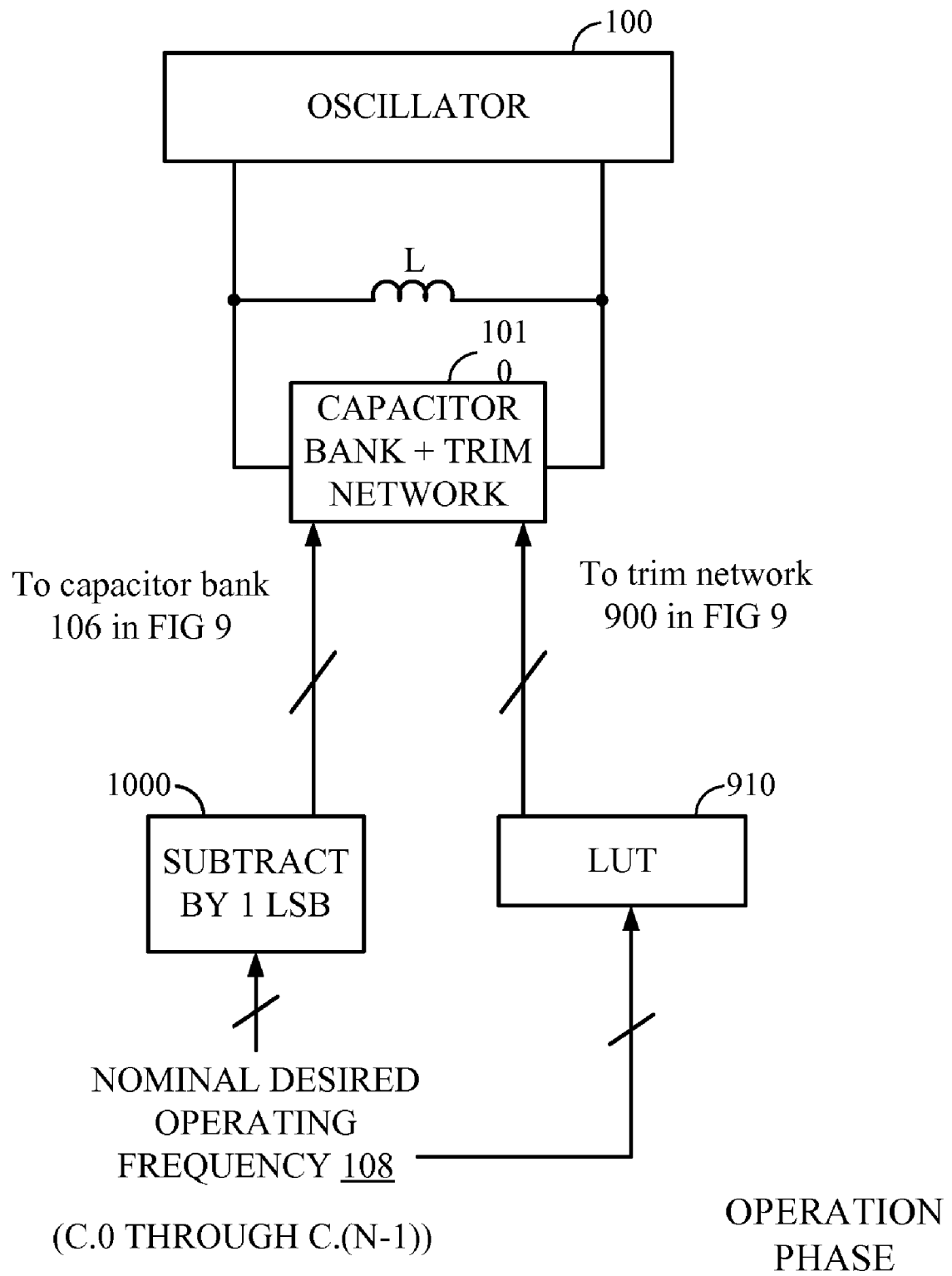
FIG. 10 depicts an embodiment of normal operation of the VCO according to the embodiment of FIG. 9.

FIG. 10 depicts an embodiment of normal operation of the VCO according to the embodiment of FIG. 9. In FIG. 10, a nominal desired frequency signal 108 is specified in terms of nominal capacitances C.0 through C.(N−1). A nominal desired operating frequency 108 is provided to an LUT 910, which outputs trim settings for calibration capacitances C.CB.0 through C.CB.M according to FIG. 9. Signal 108 is also input to a module 1000 that subtracts 1 LSB from signal 108. This is done to allow the net trimming value required from trimming capacitances C.CB.0 through C.CB.M to be a positive value. In alternative embodiments, any integer or fractional number of LSB's may be subtracted from the signal 108 to achieve the same effect.

Note the trim network 900 may be calibrated, and the trim settings stored in an LUT, in the same manner as described above with reference to FIG. 7. In an embodiment, the entries of an LUT may associate each nominal setting of the capacitor bank 106 with a preferred set of trim settings for the calibration capacitors C.CB.0 through C.CB.M.

Figure 10A:
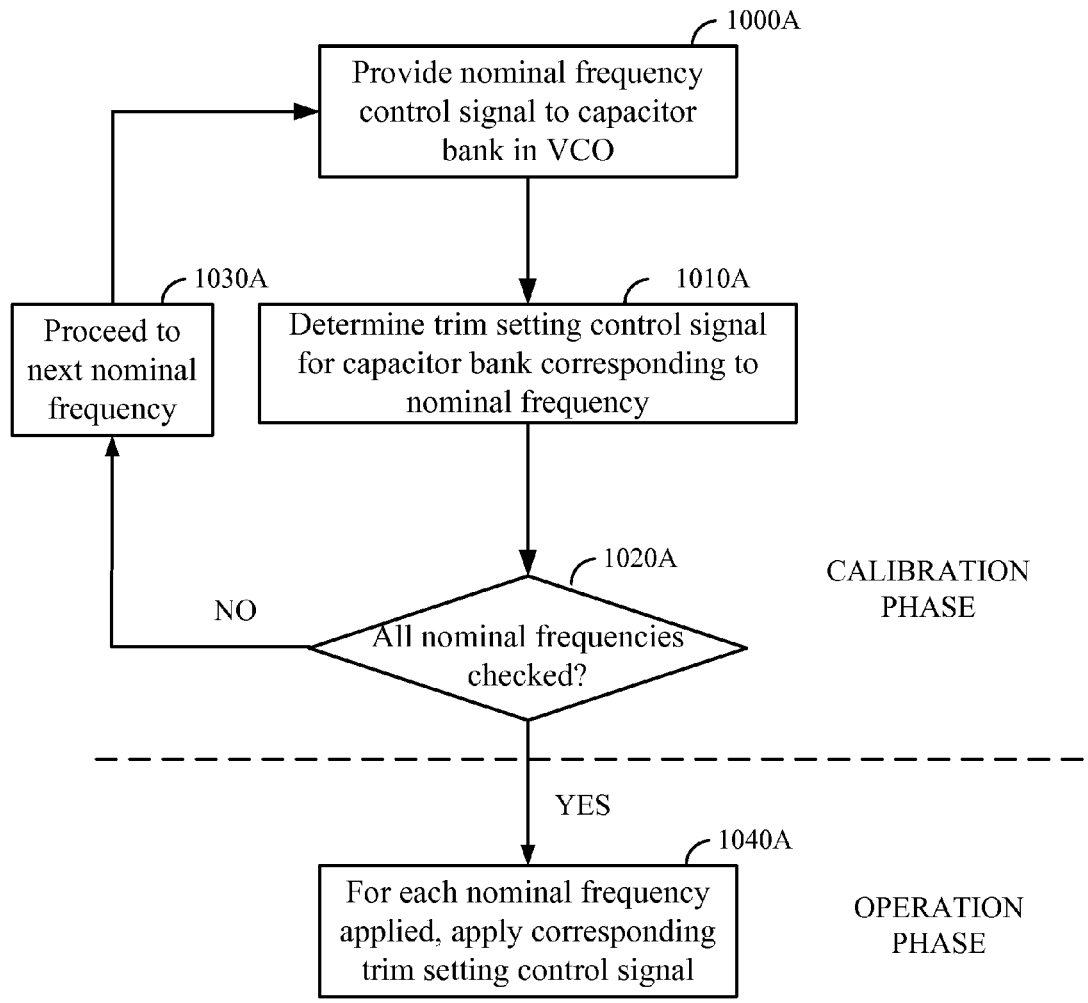
FIG. 10A depicts the steps of a method for determining trim settings for the nominal capacitances of the capacitor bank, and applying those trim settings during normal operation of the VCO.

FIG. 10A depicts the steps of a method for determining trim settings for the nominal capacitances of the capacitor bank, and applying those trim settings during normal operation of the VCO. In FIG. 10A, the calibration phase includes steps 1000A through 1030A, while the operation phase includes step 1040A. At step 1000A, the method provides a nominal frequency control signal to the capacitor bank of a VCO. At step 1010A, the method determines a trim setting control signal for the capacitor bank corresponding to the nominal frequency provided. At step 1020A, the method determines whether all nominal frequencies of interest have been checked in steps 1000A and 1010A. If NO, then the method proceeds to the next nominal frequency at step 1030A. If YES, then the method proceeds to step 1040A, where for each nominal frequency applied, the corresponding trim setting control signal determined during the calibration phase is applied.

Note the method of FIG. 10A is shown for illustration only, and is not meant to limit the scope of the present disclosure to any particular embodiment of calibration method shown.

Figure 11:
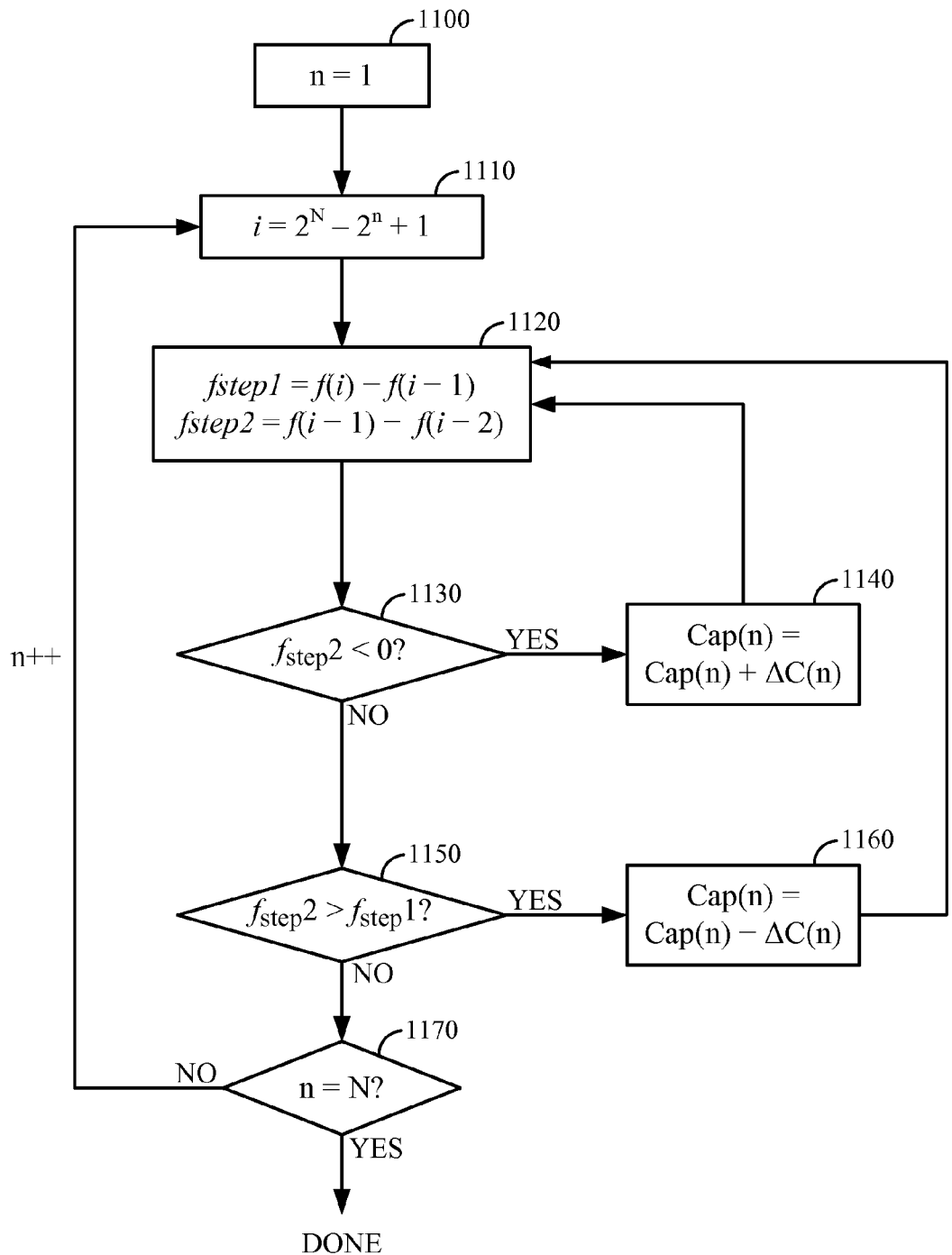
FIG. 11 depicts a further embodiment of a trim setting calibration algorithm according to the present disclosure.

FIG. 11 depicts a further embodiment of a trim setting calibration algorithm according to the present disclosure. In FIG. 11, a variable n representing the n-th capacitance in an N-bit capacitor bank is initialized to 1 at step 1100. At step 1110, a variable i representing the i-th selectable frequency in the capacitor bank is computed as $i=2^N-2^n+1$. At step 1120, two frequency steps are measured: a first step fstep1 is measured as $f(i)-f(i-1)$, while a second step fstep2 is measured as $f(i-1)-f(i-2)$, wherein $f(i)$, $f(i-1)$, and $f(i-2)$ are the frequencies measured when the i-th, (i−1)th, and (i−2)th frequency in the capacitor bank are selected, respectively.

At step 1130, the algorithm checks whether the step fstep2 is less than zero. If so, then the capacitance $C(n)$ of the n-th capacitor is increased according to the principles of the present disclosure by a unit capacitance $\Delta C(n)$ in step 1140, wherein $\Delta C(n)$ is the smallest unit capacitance provided for the n-th bit (e.g., LSB/2 or LSB/4 in an embodiment). At step 1150, the algorithm checks whether the step fstep2 is larger than the step fstep1. If so, then the capacitance $C(n)$ of the n-th capacitor is decreased according to the principles of the present disclosure by a unit capacitance $\Delta C(n)$ in step 1150, wherein $\Delta C(n)$ is again the smallest unit capacitance provided for the n-th bit. In an embodiment, the trimmable setting of $C(n)$ may be initialized to the nominal value of $C(n)$ prior to commencement of the algorithm depicted in FIG. 11.

Note the techniques of the present disclosure have been described with reference to a voltage-controlled oscillator (VCO). In an embodiment of an analog VCO, the oscillating frequency may be coarse tuned by selectively switching on and off capacitors in the capacitor bank as described, based on a set of digital control voltages. The frequency may then be fined tuned by controlling the capacitance of a varactor using an analog voltage. In such an embodiment, the VCO control signal may comprise a plurality of digital signals to control the coarse tuning, in addition to an analog signal to control the fine tuning. Alternatively, in an embodiment of a digital VCO, or a DCO (digitally controlled oscillator), both coarse tuning and fine tuning of the operating capacitance may be controlled using digital signals. Note in this specification and in the claims, the term voltage-controlled oscillator (VCO) will be understood to encompass both analog VCO's and digital VCO's (DCO's). One of ordinary skill in the art will realize that the techniques disclosed herein may readily be applied to both digital and analog VCO's.

Figure 12:
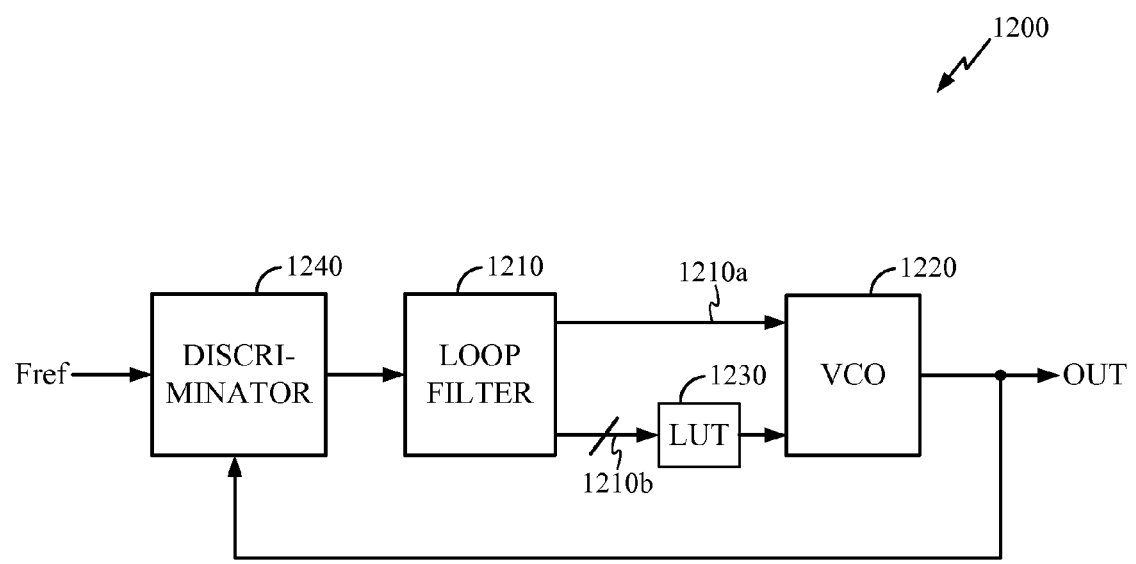
FIG. 12 depicts an embodiment of a capacitor bank according to the present disclosure within an analog VCO that makes up part of a phase-locked loop (PLL).

FIG. 12 depicts an embodiment of a capacitor bank according to the present disclosure within an analog VCO that makes up part of a phase-locked loop (PLL). In FIG. 12, a PLL 1200 includes a discriminator 1240 for comparing a reference frequency Fref with an output signal OUT. The discriminator may compare, e.g., the phase, frequencies, or other characteristics of the signals input to the discriminator. The output of the discriminator is provided to a loop filter 1210. The loop filter outputs a control signal 1210a as a fine tuning analog control signal to the VCO 1220, as well as a control signal 1210b as a coarse tuning digital control to the VCO 1220. In an embodiment of an analog VCO, the fine tuning control signal 1210a may be an analog signal supplied to a varactor within an analog VCO 1220. In an embodiment of a DCO, the fine tuning control signal 1210a may be a digital signal supplied to a bank of selectable capacitances within a DCO 1220.

In an embodiment, the coarse tuning control signal 1210*b* may be a digital signal supplied to a look-up table (LUT) 1230 containing capacitance trim settings according to the present disclosure. The output of the LUT 1230 may be provided to the VCO 1220. The VCO generates an output signal OUT that is fed back to the discriminator 1240.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A method for adjusting the output frequency of a voltage-controlled oscillator (VCO), the VCO comprising a capacitor bank, the capacitor bank comprising a plurality of nominal selectable capacitances, the method comprising:
   during a calibration phase, providing at least one nominal frequency control signal to the capacitor bank in the VCO, and determining a trim setting control signal for the capacitor bank corresponding to said at least one nominal frequency control signal, wherein determining a trim setting control signal for the capacitor bank comprises:
   measuring a first output frequency of the VCO corresponding to a first trim setting control signal;
   measuring a second output frequency of the VCO corresponding to a second trim setting control signal;
   selecting the trim setting control signal corresponding to a VCO output frequency being closer to the at least one nominal frequency control signal; and
   during an operation phase, applying the at least one nominal frequency control signal to said capacitor bank in the VCO in conjunction with the corresponding trim setting control signal determined during said calibration phase.

2. The method of claim 1, the applying the at least one nominal frequency control signal to said capacitor bank in the VCO in conjunction with the corresponding trim setting control signal comprising:
   selectively enabling a plurality of sub-capacitances associated with the nominal selectable capacitances in the VCO, the plurality of sub-capacitances configurable to contribute to the capacitance of the at least one selectable capacitance.

3. The method of claim 2, each of the plurality of sub-capacitances having a capacitance less than the nominal value of the corresponding nominal selectable capacitance.

4. The method of claim 2, the trim setting control signal comprising multiple control signals, each control signal opening or closing a switch to disable or enable a corresponding capacitance.

5. The method of claim 2, the plurality of sub-capacitances comprising a plurality of binary-weighted sub-capacitances.

6. The method of claim 2, the determining a trim setting control signal for the capacitor bank corresponding to said at least one nominal frequency control signal comprising:
   setting the nominal frequency control signal to first, second, and third nominal frequencies, and measuring corresponding first, second, and third output frequencies, the first nominal frequency being larger than the second nominal frequency by a nominal step size, the second nominal frequency being larger than the third nominal frequencies by the same nominal step size, the difference between the first and second output frequencies being a first actual step size, the difference between the second and third output frequencies being a second actual step size;
   if the second actual step size is less than zero, adjusting a trim setting control signal to increase a selectable capacitance in the capacitor bank associated with the first nominal frequency; and
   if the second actual step size is greater than the first actual step size, adjusting a trim setting control signal to decrease a selectable capacitance in the capacitor bank associated with the first nominal frequency.

7. The method of claim 6, the determining a trim setting control signal for the capacitor bank corresponding to said at least one nominal frequency control signal further comprising:
   repeating the steps of setting the nominal frequency control signal to first, second, and third nominal frequencies, and adjusting the trim setting control signal for a plurality of the nominal selectable capacitances in the capacitor bank.

8. The method of claim 6, further comprising determining a trim setting control signal for the capacitor bank corresponding to each of the plurality of nominal frequency control signals.

9. A voltage-controlled oscillator (VCO) comprising:
   means for, during a calibration phase, providing at least one nominal frequency control signal to the capacitor bank in the VCO, and determining a trim setting control signal for the capacitor bank corresponding to said at least one nominal frequency control signal, wherein said means for determining a trim setting control signal for the capacitor bank comprises:

means for measuring a first output frequency of the VCO corresponding to a first trim setting control signal;

means for measuring a second output frequency of the VCO corresponding to a second trim setting control signal;

means for selecting the trim setting control signal corresponding to a VCO output frequency being closer to the at least one nominal frequency control signal; and means for, during an operation phase, applying the at least one nominal frequency control signal to said capacitor bank in the VCO in conjunction with the corresponding trim setting control signal determined during said calibration phase.

10. The VCO of claim 9, the means for applying the at least one nominal frequency control signal comprising:

means for selectively enabling a plurality of sub-capacitances associated with the nominal selectable capacitances in the VCO, the plurality of sub-capacitances configurable to contribute to the capacitance of the at least one selectable capacitance.

11. A computer program product for adjusting the output frequency of a voltage-controlled oscillator (VCO), the VCO comprising a capacitor bank, the capacitor bank comprising a plurality of nominal selectable capacitances, the product comprising:

computer-readable medium having stored thereon a computer program comprising:

at least one instruction for causing a computer to, during a calibration phase, provide at least one nominal frequency control signal to the capacitor bank in the VCO, and determine a trim setting control signal for the capacitor bank corresponding to said at least one nominal frequency control signal, wherein the at least one instruction for causing the computer to determine a trim setting control signal for the capacitor bank further comprises:

at least one instruction for causing the computer to measure a first output frequency of the VCO corresponding to a first trim setting control signal;

at least one instruction for causing the computer to measure a second output frequency of the VCO corresponding to a second trim setting control signal;

at least one instruction for causing the computer to select the trim setting control signal corresponding to a VCO output frequency being closer to the at least one nominal frequency control signal; and at least one instruction for causing the computer to, during an operation phase, apply the at least one nominal frequency control signal to said capacitor bank in the VCO in conjunction with the corresponding trim setting control signal determined during said calibration phase.

12. The computer program product of claim 11, the at least one instruction for causing a computer to apply the at least one nominal frequency control signal during operation further comprising:

at least one instruction for causing the computer to measure a first output frequency of the VCO corresponding to a first trim setting control signal;

at least one instruction for causing the computer to measure a second output frequency of the VCO corresponding to a second trim setting control signal;

at least one instruction for causing the computer to select the trim setting control signal corresponding to a VCO output frequency being closer to the at least one nominal frequency control signal.

13. A capacitor bank for a voltage-controlled oscillator (VCO), the capacitor bank comprising a plurality of nominal selectable capacitances, the plurality of nominal selectable capacitances comprising a minimum capacitance associated with a least significant bit (LSB), the capacitor bank further comprising:

a trim network comprising a plurality of selectable trim capacitances for adjusting the capacitance of the capacitor bank, the plurality of selectable trim capacitances comprising at least one trim capacitance less than the capacitance associated with the (LSB); and a subtraction unit configured to receive a nominal operating frequency input and subtract a LSB value from the nominal operating frequency input signal.

14. The capacitor bank for the VCO of claim 13, wherein a net trimming value for trimming capacitance is a positive value.

15. The capacitor bank for the VCO of claim 14, wherein the subtraction unit is further configured to subtract any integer number of LSBs from the nominal operating input frequency input.

16. The capacitor bank for the VCO of claim 14, wherein the subtraction unit is further configured to subtract any fractional number of LSBs from the nominal operating input frequency input.

* * * * *